United States Patent
Iwai

(10) Patent No.: US 7,499,351 B2
(45) Date of Patent: Mar. 3, 2009

(54) SEMICONDUCTOR MEMORY IN WHICH FUSE DATA TRANSFER PATH IN MEMORY MACRO IS BRANCHED

(75) Inventor: Hitoshi Iwai, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/750,702

(22) Filed: May 18, 2007

(65) Prior Publication Data

US 2007/0268760 A1    Nov. 22, 2007

(30) Foreign Application Priority Data

May 22, 2006    (JP) ............................. 2006-142036

(51) Int. Cl.
*G11C 7/00*   (2006.01)
(52) U.S. Cl. .................. 365/200; 365/230.03; 365/192; 365/255.7
(58) Field of Classification Search ............... 365/200, 365/225.7, 192, 230.03
See application file for complete search history.

(56) References Cited

U.S. PATENT DOCUMENTS

| | | | |
|---|---|---|---|
| 6,510,087 B2 | 1/2003 | Kudou et al. | |
| 6,512,709 B1 * | 1/2003 | Nakahara et al. | 365/200 |
| 7,254,069 B2 * | 8/2007 | Haraguchi et al. | 365/200 |
| 2006/0171238 A1 * | 8/2006 | Iizuka | 365/230.03 |

FOREIGN PATENT DOCUMENTS

| | | |
|---|---|---|
| JP | 2001-291397 | 10/2001 |
| JP | 2003-222656 | 8/2003 |

* cited by examiner

*Primary Examiner*—Hoai V Ho
*Assistant Examiner*—Anthan T Tran
(74) *Attorney, Agent, or Firm*—Oblon, Spivak, McClelland, Maier & Neustadt, P.C.

(57) ABSTRACT

A semiconductor device includes a memory macro and fuse box. The fuse box includes a clock generator, a plurality of first data latch circuits which latch fuse data, and serially transfer the fuse data upon receiving transfer clocks, and a clock counter which counts the transfer clocks, and generates a count-up signal when counting a predetermined number of transfer clocks. The memory macro includes a branching controller which is controlled by a branching control signal generated on the basis of the count-up signal, and branches the fuse data and transfer clocks transferred from the fuse box into a plurality of transfer paths.

16 Claims, 10 Drawing Sheets

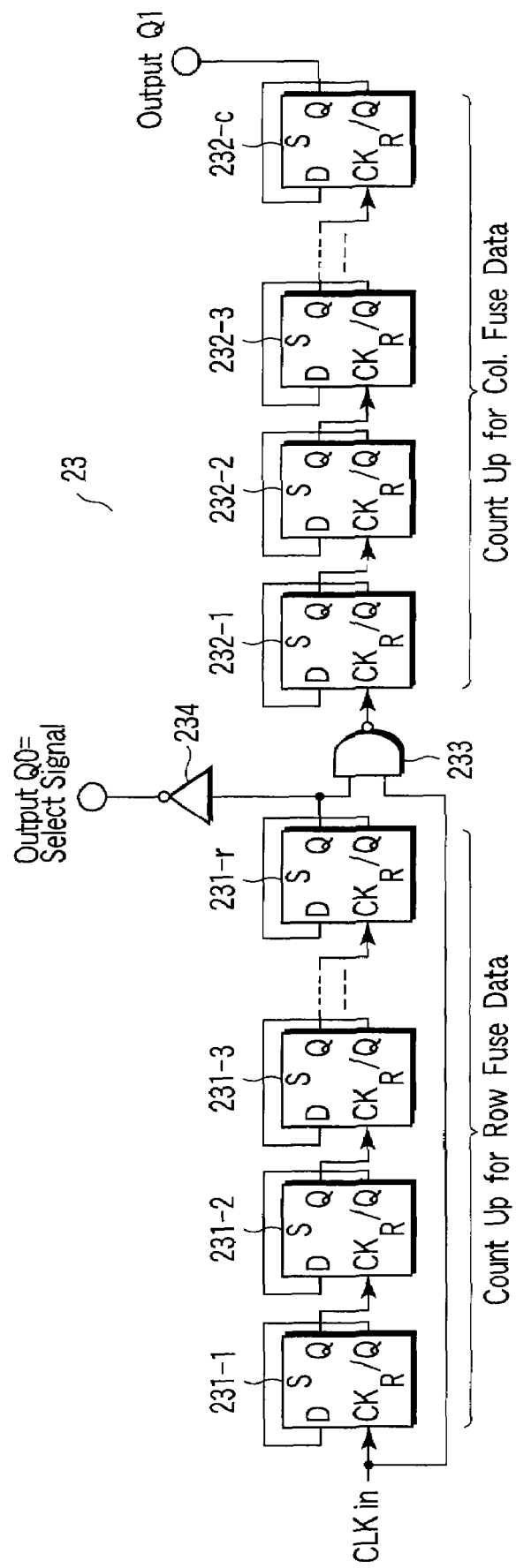
F I G. 2

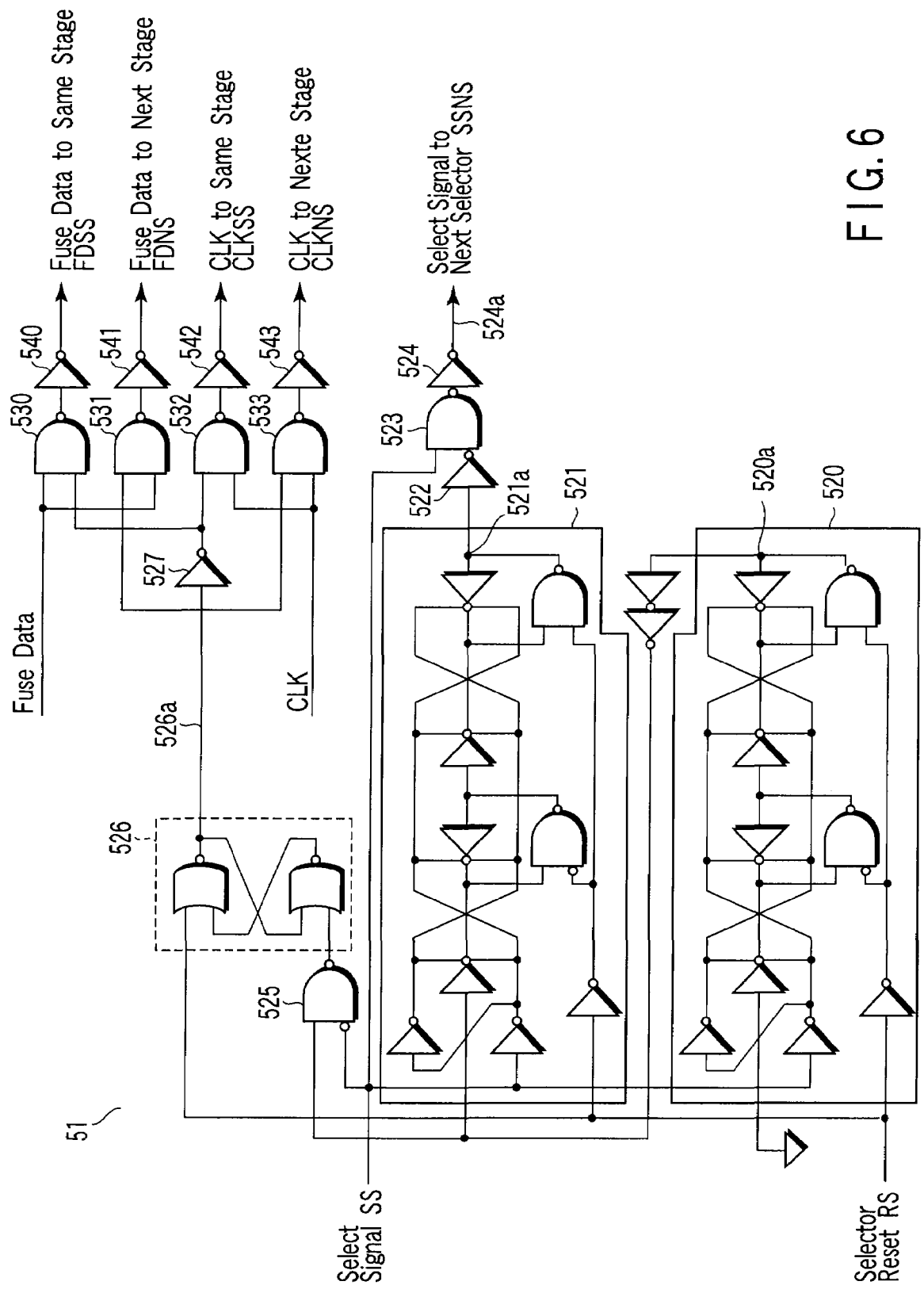
F I G. 6

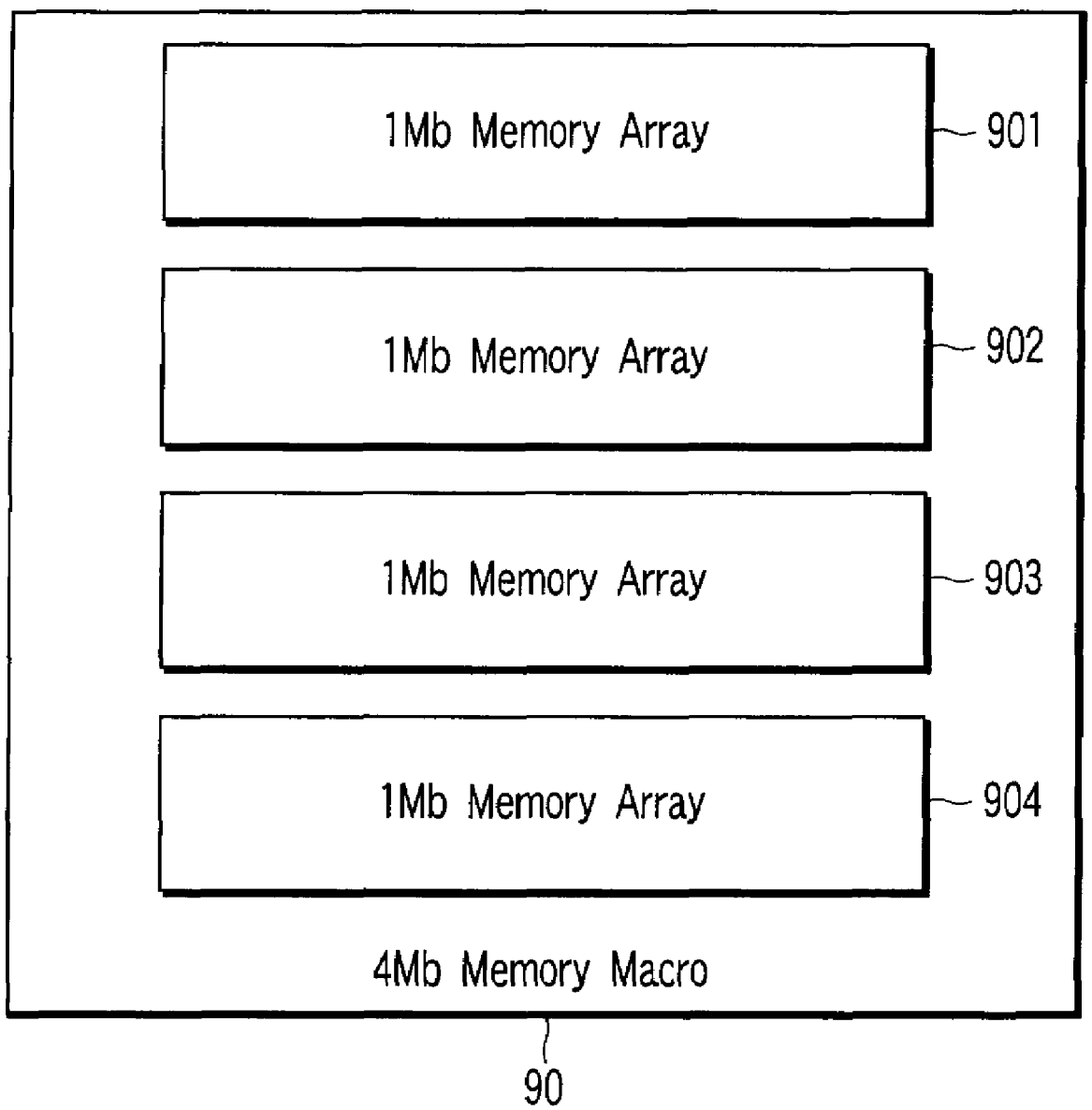
F I G. 9

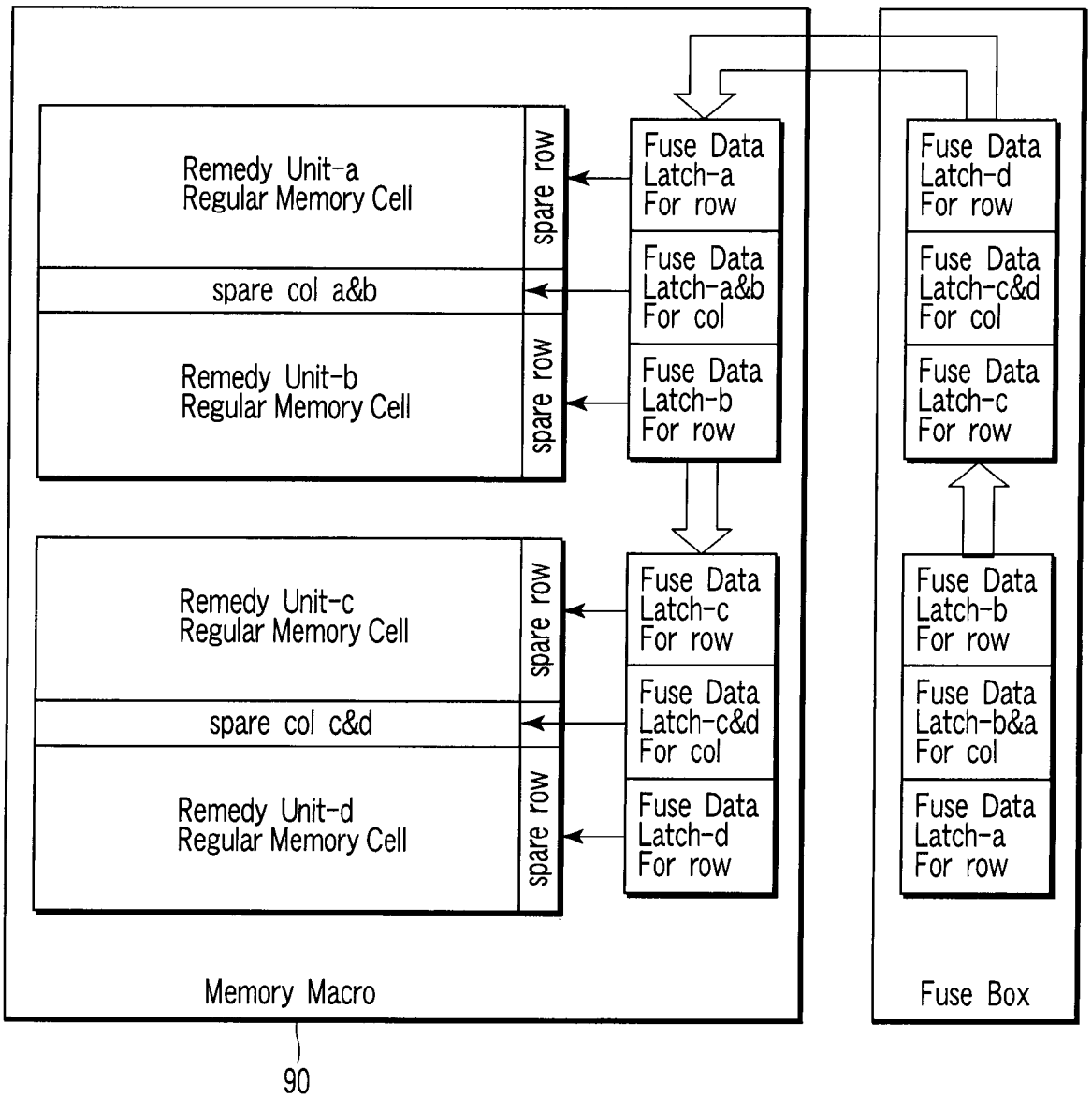
F I G. 11

SEMICONDUCTOR MEMORY IN WHICH FUSE DATA TRANSFER PATH IN MEMORY MACRO IS BRANCHED

CROSS-REFERENCE TO RELATED APPLICATIONS

This application is based upon and claims the benefit of priority from prior Japanese Patent Application No. 2006-142036, filed May 22, 2006, the entire contents of which are incorporated herein by reference.

BACKGROUND OF THE INVENTION

1. Field of the Invention

The present invention relates to a semiconductor device including a memory macro and fuse box and, more particularly, to a method of transferring fuse data in a semiconductor memory. For example, the present invention is applied to a dynamic memory.

2. Description of the Related Art

In a semiconductor memory, redundancy information is stored in a nonvolatile manner in an optical fuse (to be referred to as an o-fuse hereinafter) or an electrical fuse (to be referred to as an e-fuse hereinafter) formed in a chip. In addition to the redundancy information, trimming data for adjusting the internal power supply and internal timings and the chip ID as the fabrication log of the semiconductor memory are also stored as fuse data.

The o-fuse is made of a material such as a metal, and cut by, e.g., irradiation with a laser. Therefore, no interconnections can be formed near the o-fuse and in the layers above and below it, so interconnections cannot be efficiently formed. In an embedded memory including various circuits such as a memory macro, memory controller, and MPU, for example, it is often desirable to form interconnections for connecting these circuits over the memory macro having a large area. If o-fuses are scattered on the memory macro, however, interconnections to be formed over the memory macro are limited. This makes it impossible to efficiently form interconnections in the embedded memory as a whole.

Accordingly, an arrangement (so-called fuse box) is proposed in which o-fuses or e-fuses are not formed in the memory macro but collectively formed in one portion outside the memory macro. The fuse box has the advantages that upper interconnection layers above the memory macro can be freely formed, and the cutting efficiency of the o-fuse increases and the fuse cutting time shortens because the fuses are gathered in one portion. The cutting efficiency increases even when e-fuses are gathered in one portion.

The fuse data described above must be transferred serially by connecting latch circuits scattered in the memory macro in series. Since the fuse data is transferred to and saved in the latch circuits in synchronism with transfer clocks, the numbers of the transfer clocks, fuse data, and latch circuits must be equal.

On the other hand, it is sometimes favorable to branch the latch circuits in the memory macro, instead of serially connecting them as a fuse data transfer path. For example, this arrangement is desirable when the power supply voltages of row-redundancy latch circuits and column-redundancy latch circuits in the memory are different. However, this arrangement has the problem that a level shift circuit must be inserted in each space between the latch circuits in the transfer path formed by serially connecting them. Also, branching the transfer path is sometimes more convenient than the serial transfer performed by connecting the latch circuits in series, depending on the limitations on the layout.

Unfortunately, the above conventional method serially transfers the fuse data by using the transfer clocks equal in number to the latch circuits. Since a number of transfer paths are simultaneously driven, the power consumption increases. In addition, the fuse data transfer paths cannot be branched. If the transfer paths branch, the numbers of fuse data and clocks transmitted to each latch circuit are no longer equal. This makes it impossible to accurately stop each data in a latch circuit where the data is to be latched at the end of data transfer.

Note that Jpn. Pat. Appln. KOKAI Publication No. 2003-222656 discloses a semiconductor integrated circuit device including a high-performance test clock generator capable of a timing margin testing operation. In this semiconductor integrated circuit device, the test clock generator including a register sequential circuit and clock output controller is formed between a pulse generator and logic circuit. If a testing operation is found to be valid, the transmission of clock pulses generated by the pulse generator to the logic circuit is stopped, and the register sequential circuit controls the clock transmission controller in accordance with register setting information, thereby outputting clock pulses for operating the logic circuit by using a pulse signal generated by the pulse generator.

BRIEF SUMMARY OF THE INVENTION

According to an aspect of the present invention, there is provided a semiconductor device comprising a memory macro, and a fuse box in which fuse data to be transferred to the memory macro is stored in a nonvolatile storage element, wherein the fuse box includes a clock generator configured to generate data transfer clocks, a plurality of first data latch circuits configured to latch the fuse data, and serially transfer the fuse data upon receiving the transfer clocks, and a clock counter configured to count the transfer clocks, and generate a count-up signal when counting a predetermined number of transfer clocks, and the memory macro includes a branching controller controlled by a branching control signal generated on the basis of the count-up signal, and configured to branch the fuse data and the transfer clocks transferred from the fuse box into a plurality of transfer paths.

According to another aspect of the present invention, there is provided a semiconductor device comprising a plurality of memory macros, and a plurality of fuse boxes which are formed to correspond to the plurality of memory macros, and in which fuse data to be transferred to the plurality of memory macros is stored in a nonvolatile storage element, wherein each of the plurality of fuse boxes includes a clock generator configured to generate data transfer clocks, a plurality of first data latch circuits configured to latch the fuse data, and serially transfer the fuse data upon receiving the transfer clocks, and a clock counter configured to count the transfer clocks, and generate a count-up signal when counting a predetermined number of transfer clocks, and each of the plurality of memory macros includes a branching controller controlled by a branching control signal generated on the basis of the count-up signal, and configured to branch the fuse data and the transfer clocks transferred from the fuse box into a plurality of transfer paths.

BRIEF DESCRIPTION OF THE SEVERAL VIEWS OF THE DRAWING

FIG. 2 is a circuit diagram showing an example of the arrangement of a clock counter in the circuit shown in FIG. 1;

FIG. 6 is a circuit diagram showing an example of the arrangement of a branching controller in the circuit shown in FIG. 5;

FIG. 9 is a block diagram showing an example in which a memory macro to which the present invention is applied is divided into a plurality of remedy units;

FIG. 11 is a block diagram showing an application example of the present invention in which the remedy units of a row system and column system in a memory macro are different, and stages having different transfer paths are allocated to one half of the row system, the column system, and the other half of the row system for each remedy unit.

DETAILED DESCRIPTION OF THE INVENTION

First Embodiment

Figure 1:
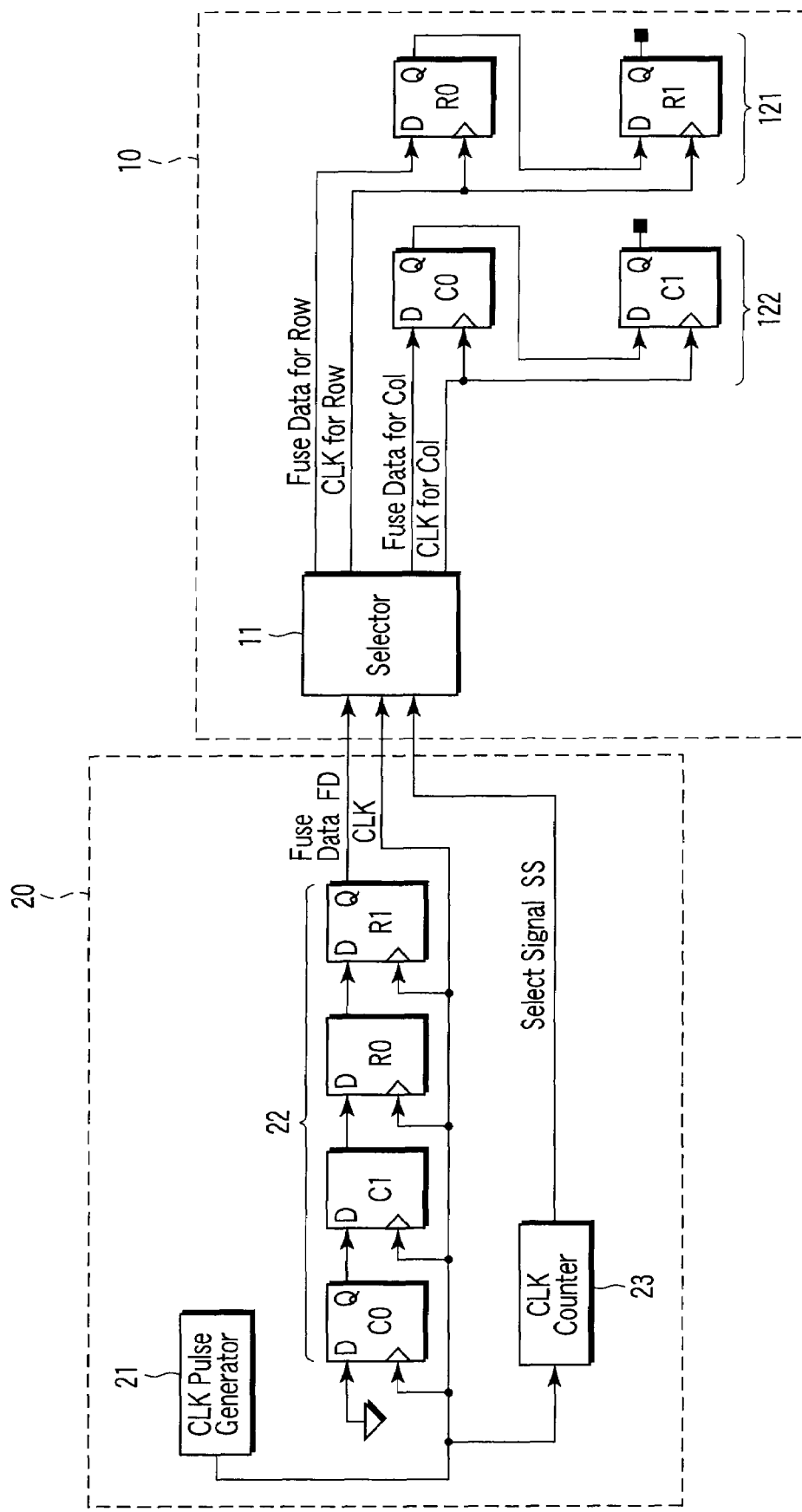
FIG. 1 is a block diagram which explains a semiconductor memory according to the first embodiment of the present invention, and specifically shows a memory macro and fuse box in a logic embedded memory.

FIG. 1 is a block diagram which explains a semiconductor memory according to the first embodiment of the present invention, and shows portions of a logic embedded memory. This memory has a memory macro 10, and a fuse box 20 in which redundancy data for remedying memory cells in the memory macro 10 or trimming data is stored in nonvolatile storage elements (fuses).

The fuse box 20 contains a clock generator (CLK pulse generator) 21, fuses (not shown; in this embodiment, o-fuses that can be fused by a laser), a data latch circuit group 22, and a clock counter (CLK counter) 23.

The CLK pulse generator 21 generates data transfer clocks CLK. The fuses store data when fused by a laser. The data latch circuit group 22 includes a plurality of data latch circuits (C0, C1, R0, and R1), and temporarily stores fuse on/off information (fuse data). A transfer line is serially connected to the data latch circuit group 22 to allow it to receive the transfer clocks CLK and serially transfer the fuse data. The CLK counter 23 counts the transfer clocks CLK, and generates a count-up signal when the count reaches a predetermined number. A branching control signal (select signal) SS is generated on the basis of this count-up signal. The select signal SS is generated in, e.g., the fuse box 20.

The memory macro 10 has a branching controller (selector) 11. Under the control of the select signal SS, the selector 11 distributes fuse data FD and the transfer clocks CLK transferred from the fuse box 20 to a plurality of transfer paths. The selector 11 of this embodiment has a function of selecting one of at least two transfer paths 121 and 122 equal in transfer path layers (stages).

The transfer path 121 has row-redundancy latch circuits R0 and R1 for storing row-redundancy fuse data. The transfer path 122 has column-redundancy latch circuits C0 and C1 for storing column-redundancy fuse data. Each latch circuit transfers the fuse data to the next latch circuit in synchronism with the transfer clock CLK.

FIG. 2 is a circuit diagram schematically showing the arrangement of the CLK counter 23 shown in FIG. 1. The CLK counter 23 includes a plurality of D flip-flop (FF) circuits 231-1 to 231-$r$ and 232-1 to 232-$c$, a NAND gate 233, and an inverter circuit 234. The CLK counter 23 generates a count-up signal when count up of, e.g., the number of row-redundancy fuse data completes.

Note that the arrangement of the CLK counter 23 is not limited to that shown in FIG. 2, and any given arrangement that practically counts transfer clocks can be applied. For example, it is possible to use a circuit configuration in which a specific logic level is input to the first shift register stage of a shift register string made up of data latch circuits equal in number to the count, each circuit stage in the shift register string is driven by transfer clocks, and the number of transfer clocks is practically counted by outputting the specific logic level from the final shift register stage.

Figure 3:
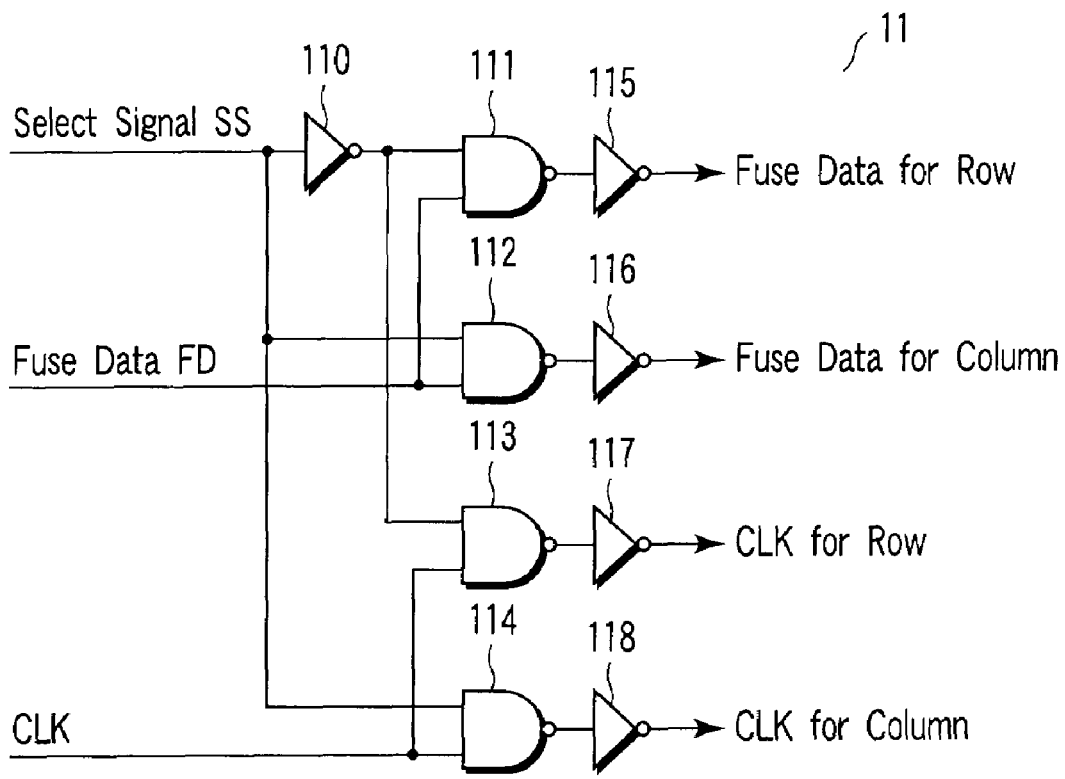
FIG. 3 is a circuit diagram showing an example of the arrangement of a branching controller in the memory macro in the circuit shown in FIG. 1.

FIG. 3 is a circuit diagram schematically showing the arrangement of the selector 11 in the memory macro shown in FIG. 1. The selector 11 includes an inverter circuit 110, NAND gates 111 to 114, and inverter circuits 115 to 118. The NAND gate 111 receives the fuse data FD transferred from the fuse box 20 and a signal obtained by inverting the select signal SS (branching control signal) by the inverter circuit 110. The NAND gate 112 receives the fuse data FD and select signal SS. The NAND gate 113 receives the clocks CLK transferred from the fuse box 20 and an inverted signal /SS of the select signal SS. The NAND gate 114 receives the clocks CLK and select signal SS. The inverter circuit 115 inverts an output signal from the NAND gate 111, and outputs the inverted signal as fuse data for row. The inverter circuit 116 inverts an output signal from the NAND gate 112, and outputs the inverted signal as fuse data for column. The inverter circuit 117 inverts an output signal from the NAND gate 113, and outputs the inverted signal as a clock CLK for row. The inverter circuit 118 inverts an output signal from the NAND gate 114, and outputs the inverted signal as a clock CLK for column.

Figure 4:
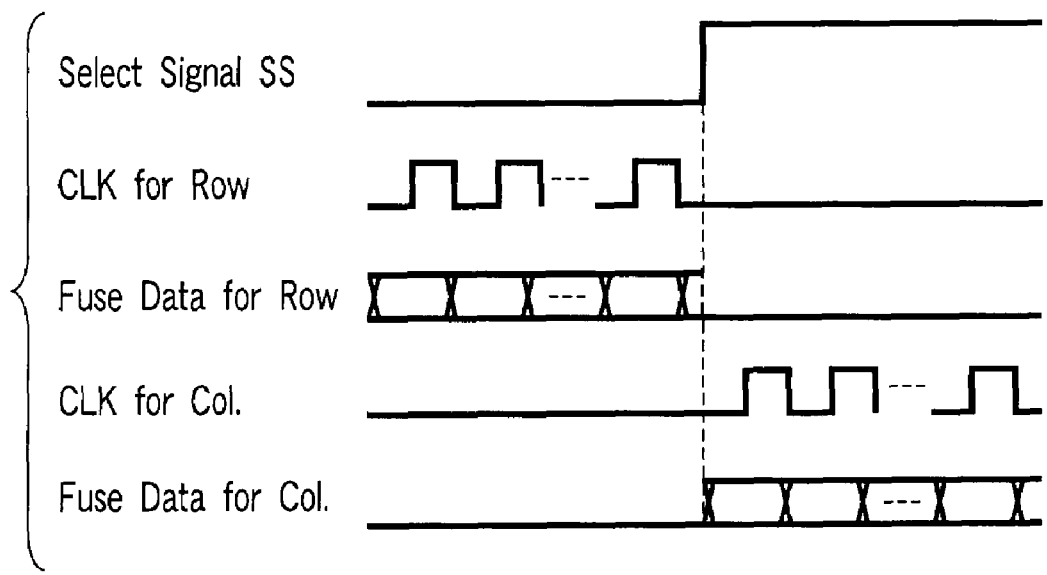
FIG. 4 is a timing chart showing an example of the operation of the circuit shown in FIG. 1.

FIG. 4 is a timing chart showing an example of the operation of the memory shown in FIG. 1. First, during row-redundancy data transfer, the select signal SS stays low, and the selector 11 having received the select signal SS supplies the clocks CLK to the row-redundancy latch circuits R0 and R1 and selects the data line. In this case, the clocks and data line for the column-redundancy latch circuits stay low. When the CLK counter 23 counts up the clocks CLK equal in number to the row-redundancy fuse data, the count-up signal (select signal SS) goes high. The selector 11 having received the select signal SS makes the clocks and data line for the row-redundancy latch circuits low, and selects the transfer paths of the column-redundancy latch circuits C0 and C1.

As described above, while the row-redundancy latch circuits R0 and R1 are transferring the row-redundancy fuse data, neither the fuse data nor the clocks are transferred to the column-redundancy latch circuits C0 and C1. On the other hand, while the column-redundancy latch circuits C0 and C1 are transferring the column-redundancy fuse data, neither the fuse data nor the clocks are transferred to the row-redundancy latch circuits R0 and R1. Even when the transfer paths branch, therefore, the numbers of the fuse data, transfer clocks, and latches are equal.

In the semiconductor memory according to the first embodiment described above, the fuse box 20 includes the CLK counter 23 for counting a predetermined number of transfer clocks and generating a count-up signal, and the memory macro 10 includes the selector 11 which receives a select signal generated from the count-up signal and distributes the fuse data and transfer clocks from the fuse box to a plurality of branched paths. By thus branching the fuse data transfer paths in the memory macro 10, it is possible to reduce transfer paths to be simultaneously driven, and reduce the power consumption of the transfer paths.

Second Embodiment

Figure 5:
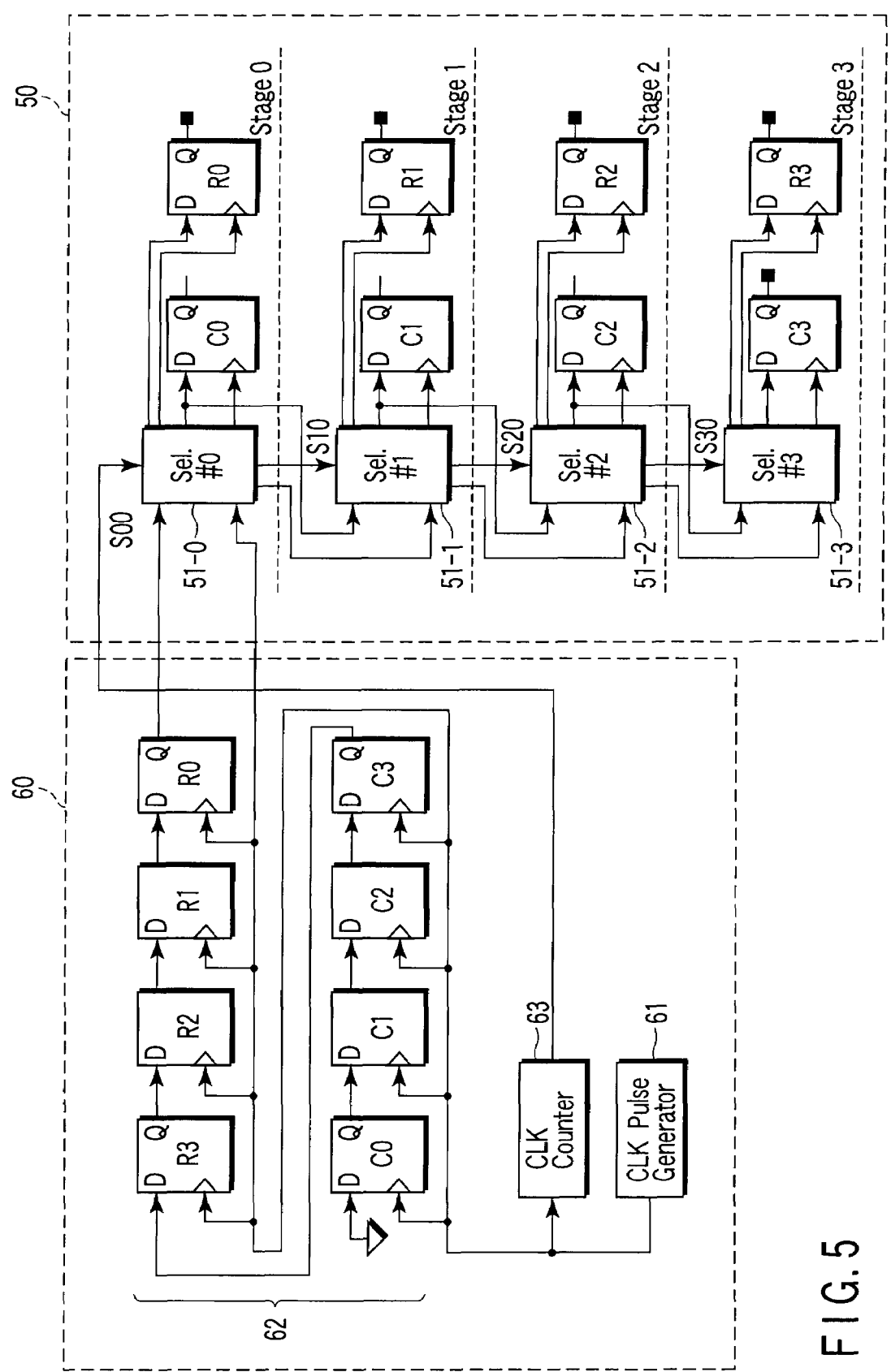
FIG. 5 is a block diagram which explains a semiconductor memory according to the second embodiment of the present invention, and specifically shows a memory macro and fuse box in a DRAM.

FIG. 5 is a block diagram which explains a semiconductor memory according to the second embodiment of the present invention, and shows portions of a DRAM (Dynamic Random Access Memory). FIG. 5 specifically shows a memory macro 50 and fuse boxy 60 in the DRAM.

The fuse box 60 includes a clock generator (CLK pulse generator) 61, a data latch circuit group 62 having a plurality of data latch circuits (R0 to R3 and C0 to C3), and a clock counter (CLK counter) 63. In the data latch circuit group 62, the data latch circuits C0 to C3 store and transfer column-redundancy fuse data, and the data latch circuits R0 to R3 store and transfer row-redundancy fuse data.

The memory macro 50 has a plurality of transfer paths having different stages (stage 0 to stage 3), and branching controllers 51-0 to 51-3 (Sel. #0 to Sel. #3) corresponding to the individual stages. More specifically, the stage branches stepwise from the main stream to branch streams. Signals S00, S10, S20, and S30 are branching control signals of the branching controllers 51-0 to 51-3. Data latch circuits C0 to C3 transfer and store column-redundancy fuse data in the individual stages. Data latch circuits R0 to R3 transfer and store row-redundancy fuse data in the individual stages.

The branching controller 51-0 formed in stage 0 has a first function which transfers clocks and data to the transfer path of the stage and does not transfer them to the lower stages until the toggle of the corresponding branching control signal S00 completes. The branching controllers 51-1 to 51-3 formed in other stages also have the same function. The branching controllers 51-0 to 51-2 formed in stages except for the final stage (stage 3) each have a second function which, when receiving the second toggle of a corresponding one of the branching control signals S00, S10, and S20, transfers clocks and data to a corresponding one of the branching controllers 51-1 to 51-3 in the lower stages by using the down edge of the signal as an up edge.

FIG. 6 is a circuit diagram schematically showing the arrangement of the branching controllers 51-0 to 51-3 shown in FIG. 5. The branching controllers 51-0 to 51-3 all have the same configuration. In the branching controller 51, shift registers 520 and 521 adjust the timings of a select signal SS. A NAND gate 523 NANDs the select signal SS and a signal obtained by inverting an output signal 521a from the shift register 521 by an inverter circuit 522, and outputs the obtained signal to an inverter circuit 524. An output signal 524a from the inverter circuit 524 is a control signal SSNS (select signal to next selector) to the branching controller in the next stage. Accordingly, not the first toggle of the select signal but the second and subsequent toggles of the select signal are transmitted to the next stage.

On the other hand, a flip-flop circuit (FF) 526 receives, at its set input terminal, a signal obtained by a NAND gate 525 by NANDing a signal obtained by transmitting an output 520a from the shift register 520 via two inverter circuit stages and an inverted signal of the select signal SS, and receives selector reset RS at its reset input terminal. An output signal 526a from the flip-flop circuit 526 is used to control branching of clocks CLK and fuse data FD transferred from the fuse box 60 on the down edge of the select signal SS. Whether to transfer the clocks CLK and fuse data FD to the current stage (the same stage) or to the next stage is controlled by controlling an inverter circuit 527 and NAND gates 530 to 533.

The NAND gate 530 receives the fuse data FD and a signal obtained by inverting the output signal 526a from the flip-flop circuit 526 by the inverter 527. The NAND gate 531 receives the fuse data FD and the output signal 526a from the flip-flop 526. The NAND gate 532 receives the clocks CLK and the signal obtained by the inverter 527 by inverting the output signal 526a from the flip-flop circuit 526. The NAND gate 533 receives the clocks CLK and the output signal 526a from the flip-flop circuit 526. An inverter circuit 540 inverts an output signal from the NAND gate 530 to obtain fuse data FDSS (fuse data to same stage) to be transferred to the same stage. An inverter circuit 541 inverts an output signal from the NAND gate 531 to obtain fuse data FDNS (fuse data to next stage) to be transferred to the next stage. An inverter circuit 542 inverts an output signal from the NAND gate 532 to obtain a clock CLKSS (clock CLK to same stage) to be transferred to the same stage. An inverter circuit 543 inverts an output signal from the NAND gate 533 to obtain a clock CLKNS (clock CLK to next stage) to be transferred to the next stage.

Figure 7:
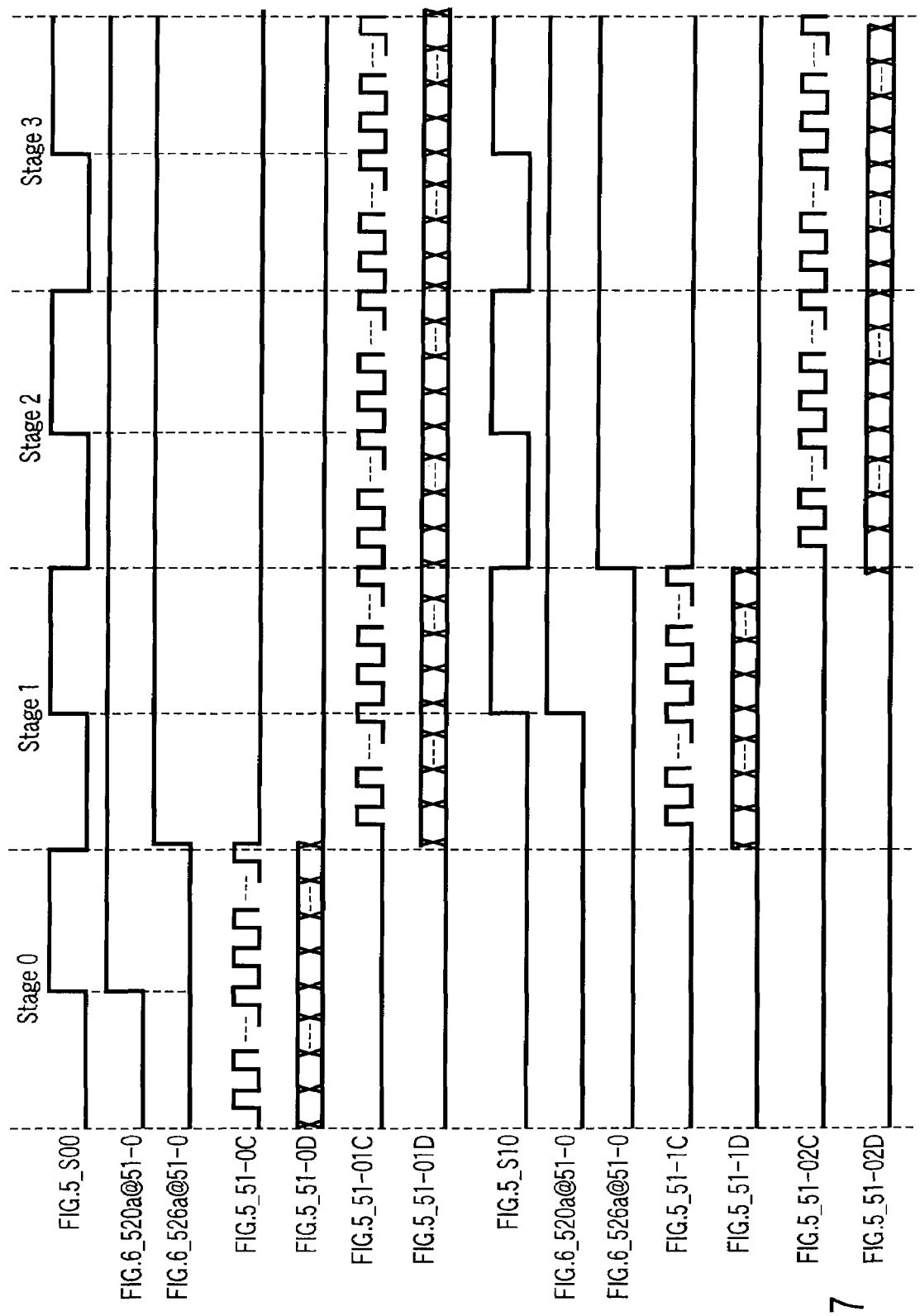
FIG. 7 is a timing chart showing part of an example of the operation of the circuit shown in FIG. 5.
Figure 8:
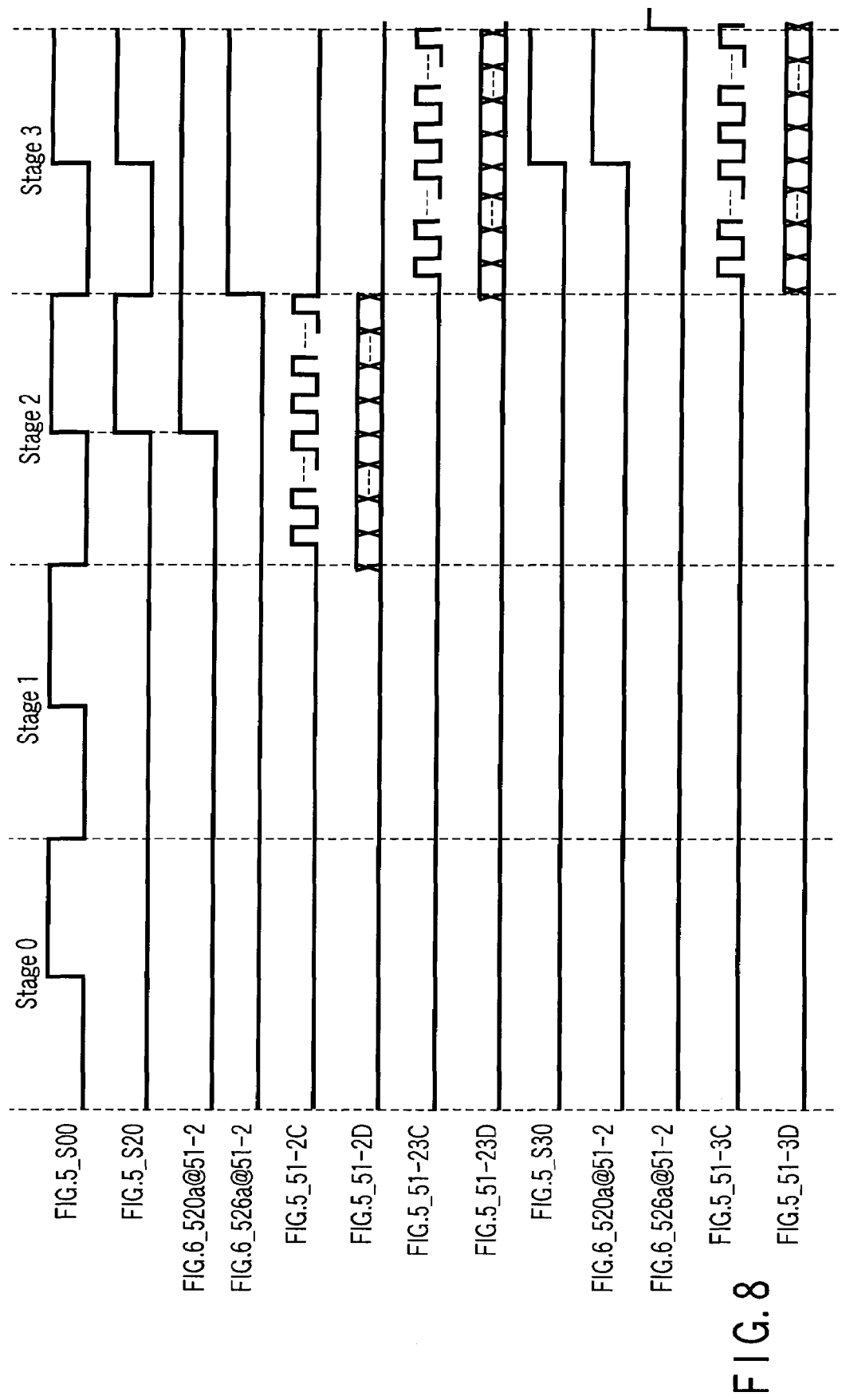
FIG. 8 is a timing chart showing part of the example of the operation of the circuit shown in FIG. 5.

FIGS. 7 and 8 are timing charts showing an example of the operation of the DRAM shown in FIG. 5. A transfer operation in the DRAM shown in FIGS. 5 and 6 will be explained below with reference to FIGS. 7 and 8. An operation of transfer to the row system and an operation of transfer to the column system performed by the branching control signal in each stage of the DRAM shown in FIG. 5 slightly differ from the first embodiment. Major differences from the first embodiment are that there is no branch to the row system and column system in each stage and serial transfer is performed, and that until transfer to a stage of interest completes the select signal SS to the next and subsequent stages stays low.

A practical operation will be explained below. First, before the start of fuse data transfer, the selector reset RS enters Sel. #0 to Sel. #03 (51-0 to 51-3) to reset the shift registers 520 and 521 and flip-flop 526 (FIG. 6). After that, data is sequentially transferred from stage 0. In stage 0 shown in FIG. 7, until the first toggle of the select signal completes, the select signal S10 to be supplied to stage 1 and the subsequent stages and CLK (FIG. 5_51-01C) and fuse data (FIG. 5_51-01D) to be supplied to stage 1 are kept low in the branching controller 51-0 shown in FIG. 5. Meanwhile, the clock (FIG. 5_51-01C) and fuse data (FIG. 5_51-0D) are transmitted to stage 0.

When the first toggle of the select signal SS completes, transfer of the clock (FIG. 5_51-01C) and fuse data (FIG. 5_51-01D) to stage 1 is started while the clock (FIG. 5_51-0C) and fuse data (FIG. 5_51-0D) in stage 0 are kept low. In addition, until the second toggle of the select signal completes, the select signal S20 to be supplied to stage 2 and the subsequent stages and CLK (FIG. 5_51-12C) and fuse data (FIG. 5_51-12D) to be supplied to stage 2 are kept low in the branching controller 51-1 shown in FIG. 5. Meanwhile, the clock (FIG. 5_51-1C) and fuse data (FIG. 5_51-1D) are transmitted to stage 1. After that, the fuse data is sequentially transferred by performing similar operations in stages 2 and 3.

According to the second embodiment, in a memory having the function of transferring the fuse data FD stored in the fuse box 60 to the memory macro 50 and latching the data, the fuse box 60 has the clock counter 63 which generates a count-up signal by counting a predetermined number of clocks CLK, and the memory macro 50 has the branching controllers 51-0 to 51-3 which receive the select signal SS generated from the count-up signal, and distribute the fuse data FD and clocks CLK from the fuse box 60 to the transfer paths of different stages, i.e., from the main stream to branch streams. By thus branching the fuse data transfer paths in the memory macro 50, it is possible to reduce transfer paths to be simultaneously driven, and reduce the power consumption of the transfer paths. The power consumption reducing effect is significantly large especially when the second embodiment is applied to a large-capacity DRAM having a large number of data to be remedied.

Figure 10:
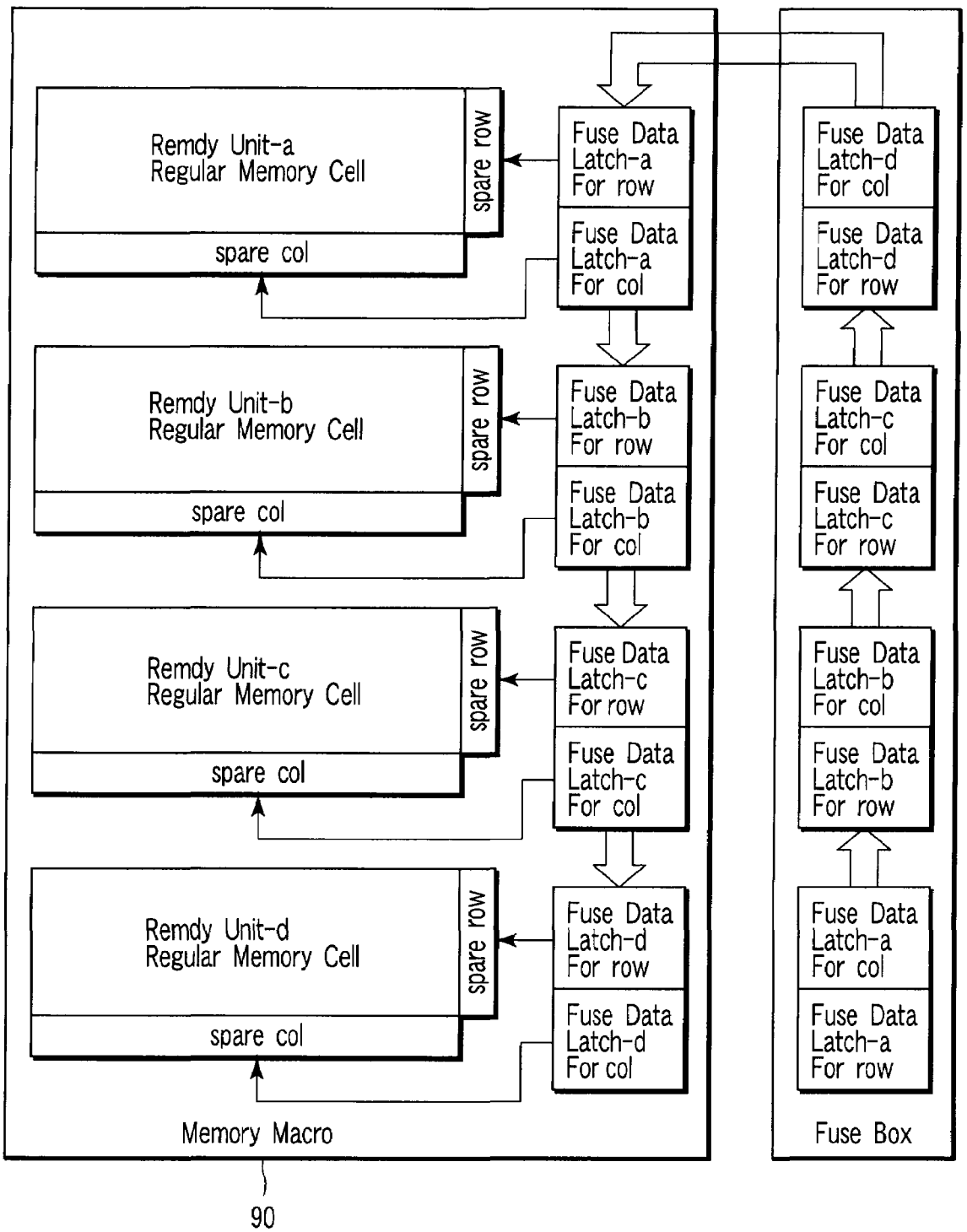
FIG. 10 is a block diagram showing an application example of the present invention in which the remedy units of a row system and column system in a memory macro are the same, and stages having different transfer paths are allocated to the row system and column system for each remedy unit.

The second embodiment is conveniently applicable to a memory in which a memory macro is divided into a plurality of remedy units, e.g., a 4-Mb (Megabits) memory macro 90 is divided into four 1-Mb memory array units 901 to 904 as shown in FIG. 9, because a plurality of data latch circuits of the memory macro can be formed for each remedy unit. That is, when a row system and column system in the memory macro 90 have the same remedy unit as shown in FIG. 10, stages having different transfer paths can be allocated to the row system and column system for each remedy unit. Also, when a row system and column system in the memory macro 90 have different remedy units as shown in FIG. 11, stages having different transfer paths can be allocated to one half of the row system, the column system, and the other half of the row system for each remedy unit.

Accordingly, an aspect of the present invention can branch fuse data transfer paths in a memory macro, reduce transfer paths to be simultaneously driven, and reduce the power consumption of the transfer paths.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a memory macro; and
   a fuse box in which fuse data to be transferred to the memory macro is stored in a nonvolatile storage element,
   wherein the fuse box includes a clock generator configured to generate data transfer clocks, a plurality of first data latch circuits configured to latch the fuse data, and serially transfer the fuse data upon receiving the transfer clocks, and a clock counter configured to count the transfer clocks, and generate a count-up signal when counting a predetermined number of transfer clocks, and
   the memory macro includes a branching controller controlled by a branching control signal generated on the basis of the count-up signal, and configured to branch the fuse data and the transfer clocks transferred from the fuse box into a plurality of transfer paths;
   wherein said plurality of transfer paths are different in stage, and the branching controller is formed in each stage,
   the branching controller formed in each stage has a first function which, when receiving a first toggle of the branching control signal, transfers data to a transfer path of the stage, and does not transfer the data to any lower stage, and
   the branching controller formed in each stage except for a final stage has a second function which, when receiving a second toggle of the branching control signal, transfers data to the branching controller in a lower stage.

2. A device according to claim 1, wherein said plurality of transfer paths comprise at least two transfer paths substantially equal in stage, and the branching controller is configured to select one of said at least two transfer paths substantially equal in stage.

3. A device according to claim 1, wherein
   said plurality of transfer paths comprise a plurality of second data latch circuits which serially transfer the fuse data upon receiving the transfer clocks branched from the branching controller, and
   the clock counter generates the count-up signal when counting the transfer clocks equal in number to said plurality of second data latch circuits included in said plurality of transfer paths.

4. A device according to claim 3, wherein
   the memory macro is divided into a plurality of remedy units, and
   said plurality of second data latch circuits are formed for each remedy unit in the memory macro.

5. A device according to claim 2, wherein
   the branching controller comprises:
   a first NAND gate which receives fuse data transferred from the fuse box and an inverted signal of the branching control signal;
   a second NAND gate which receives the fuse data and the branching control signal;
   a third NAND gate which receives a clock transferred from the fuse box and the inverted signal of the branching control signal; and
   a fourth NAND gate which receives the clock and the branching control signal,
   an output signal from the first NAND gate is used as fuse data for row, an output signal from the second NAND gate is used as fuse data for column, an output signal from the third NAND gate is used as a clock for row, and an output signal from the fourth NAND gate is used as a clock for column.

6. A device according to claim 1, wherein
   the branching controller comprises:
   a first shift register and a second shift register configured to adjust timings of the branching control signal;
   a first NAND gate which receives an inverted signal from the second shift register and the branching control signal, and outputs a control signal to the branching controller in a next stage;
   a second NAND gate which receives an output signal from the first shift register and an inverted signal of the branching control signal; and
   a flip-flop circuit which receives an output signal from the second NAND gate at a set input terminal, and selector reset at a reset input terminal, and an output signal from the flip-flop circuit is used to control branching of the clock and the fuse data transferred from the fuse box on a down edge of the branching control signal.

7. A device according to claim 6, wherein
the branching controller further comprises:
a third NAND gate which receives the fuse data and an inverted signal of the output signal from the flip-flop circuit;
a fourth NAND gate which receives the fuse data and the output signal from the flip- flop circuit;
a fifth NAND gate which receives the clock and the inverted signal of the output signal from the flip-flop circuit; and
a sixth NAND gate which receives the clock and the output signal from the flip-flop circuit,
an output signal from the third NAND gate is used as fuse data to be transferred to the same stage, an output signal from the fourth NAND gate is used as fuse data to be transferred to a next stage, an output signal from the fifth NAND gate is used as a clock to be transferred to the same stage, and an output signal from the sixth NAND gate is used as a clock to be transferred to the next stage.

8. A semiconductor device comprising:
a plurality of memory macros; and
a plurality of fuse boxes which are formed to correspond to said plurality of memory macros, and in which fuse data to be transferred to said plurality of memory macros is stored in a nonvolatile storage element,
wherein each of said plurality of fuse boxes includes a clock generator configured to generate data transfer clocks, a plurality of first data latch circuits configured to latch the fuse data, and serially transfer the fuse data upon receiving the transfer clocks, and a clock counter configured to count the transfer clocks, and generate a count-up signal when counting a predetermined number of transfer clocks, and
each of said plurality of memory macros includes a branching controller controlled by a branching control signal generated on the basis of the count-up signal, and configured to branch the fuse data and the transfer clocks transferred from the fuse box into a plurality of transfer paths;
wherein said plurality of transfer paths are different in stage, and the branching controller is formed in each stage,
the branching controller formed in each stage has a first function which, when receiving a first toggle of the branching control signal, transfers data to a transfer path of the stage, and does not transfer the data to any lower stage, and
the branching controller formed in each stage except for a final stage has a second function which, when receiving a second toggle of the branching control signal, transfers data to the branching controller in a lower stage.

9. A device according to claim 8, wherein each of said plurality of memory macros and each of said plurality of fuse boxes are formed for each remedy unit.

10. A device according to claim 8, wherein said plurality of fuse boxes and said plurality of memory macros are equal in number, and said plurality of fuse boxes are formed in one-to-one correspondence with said plurality of memory macros.

11. A device according to claim 8, wherein the branching controller is configured to select one of at least two transfer paths equal in stage.

12. A device according to claim 8, wherein
said plurality of transfer paths comprise a plurality of second data latch circuits which serially transfer the fuse data upon receiving the transfer clocks branched from the branching controller, and
the clock counter generates the count-up signal when counting the transfer clocks equal in number to said plurality of second data latch circuits included in said plurality of transfer paths.

13. A device according to claim 12, wherein said plurality of second data latch circuits are formed for each remedy unit in the memory macro.

14. A device according to claim 8, wherein
the branching controller comprises:
a first NAND gate which receives fuse data transferred from the fuse box and an inverted signal of the branching control signal;
a second NAND gate which receives the fuse data and the branching control signal;
a third NANP gate which receives a clock transferred from the fuse box and the inverted signal of the branching control signal; and
a fourth NAND gate which receives the clock and the branching control signal,
an output signal from the first NAND gate is used as fuse data for row, an output signal from the second NAND gate is used as fuse data for column, an output signal from the third NAND gate is used as a clock for row, and an output signal from the fourth NAND gate is used as a clock for column.

15. A device according to claim 8 wherein
the branching controller comprises:
a first shift register and a second shift register configured to adjust timings of the branching control signal;
a first NAND gate which receives an inverted signal from the second shift register and the branching control signal, and outputs a control signal to the branching controller in a next stage;
a second NAND gate which receives an output signal from the first shift register and an inverted signal of the branching control signal; and
a flip-flop circuit which receives an output signal from the second NAND gate at a set input terminal, and selector reset at a reset input terminal, and
an output signal from the flip-flop circuit is used to control branching of the clock and the fuse data transferred from the fuse box on a down edge of the branching control signal.

16. A device according to claim 15, wherein
the branching controller further comprises:
a third NAND gate which receives the fuse data and an inverted signal of the output signal from the flip-flop circuit;
a fourth NAND gate which receives the fuse data and the output signal from the flip-flop circuit;
a fifth NAND gate which receives the clock and the inverted signal of the output signal from the flip-flop circuit; and
a sixth NAND gate which receives the clock and the output signal from the flip-flop circuit,
an output signal from the third NAND gate is used as fuse data to be transferred to the same stage, an output signal from the fourth NAND gate is used as fuse data to be transferred to a next stage, an output signal from the fifth NAND gate is used as a clock to be transferred to the same stage, and an output signal from the sixth NAND gate is used as a clock to be transferred to the next stage.

* * * * *